(12) United States Patent
Stark et al.

(10) Patent No.: US 6,449,163 B1
(45) Date of Patent: *Sep. 10, 2002

(54) INBOARD RETENTION SYSTEM FOR PROCESSOR ENCLOSURE ASSEMBLIES WITH SUBSTRATE ALIGNMENT

(75) Inventors: Michael R. Stark, Tempe; Michael L. Rutigliano, Chandler, both of AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 8 days.

(21) Appl. No.: 09/093,138

(22) Filed: Jun. 8, 1998

(51) Int. Cl.[7] .................................................. H05K 7/20
(52) U.S. Cl. ....................... 361/752; 361/801; 361/802; 361/704; 439/377
(58) Field of Search ............................... 361/752, 801, 361/802, 764, 759, 789, 715, 728, 729, 730, 767, 753, 756, 704, 796; 439/377; 211/41.1

(56) References Cited

U.S. PATENT DOCUMENTS

| 3,539,879 A | * | 11/1970 | Bradley et al. ............. 361/801 |
| 3,662,224 A | | 5/1972 | Rauch ......................... 317/101 |
| 3,801,874 A | | 4/1974 | Stefani ........................ 317/100 |
| 3,829,741 A | * | 8/1974 | Athey .......................... 317/101 |
| 3,895,267 A | | 7/1975 | Gordon et al. ............... 317/120 |
| 3,932,016 A | * | 1/1976 | Ammenheuser ............. 339/65 |
| 4,110,552 A | | 8/1978 | Lombardi ............... 174/35 MS |
| 4,266,267 A | | 5/1981 | Ruegg ......................... 361/386 |
| 4,521,827 A | | 6/1985 | Jordan et al. ................ 361/386 |
| 4,602,315 A | | 7/1986 | Breese ........................ 361/388 |
| 4,652,971 A | | 3/1987 | Peterson et al. ............. 361/386 |
| 4,717,989 A | | 1/1988 | De Barros et al. .......... 361/424 |
| 4,899,256 A | | 2/1990 | Sway-Tin .................... 361/386 |
| 4,910,434 A | | 3/1990 | Doumani et al. ............... 315/3 |
| 4,917,618 A | | 4/1990 | Behrens et al. ............. 439/157 |
| 5,006,667 A | | 4/1991 | Lonka ...................... 174/35 R |
| 5,014,160 A | | 5/1991 | McCoy, Jr. .................. 361/424 |
| 5,020,866 A | | 6/1991 | McIlwraith ............... 312/265.4 |
| 5,043,534 A | | 8/1991 | Mahulikar et al. .......... 174/52.4 |
| 5,055,971 A | | 10/1991 | Fudala et al. ................ 361/400 |
| 5,241,453 A | | 8/1993 | Bright et al. ................ 361/704 |
| RE34,393 E | | 9/1993 | McIlwraith ............... 312/265.4 |
| 5,250,752 A | | 10/1993 | Cutright ................ 174/35 MS |
| 5,278,351 A | | 1/1994 | Herrick ..................... 174/35 R |
| 5,289,347 A | | 2/1994 | McCarthy et al. ........... 361/809 |
| 5,294,994 A | | 3/1994 | Robinson et al. ............ 348/825 |

(List continued on next page.)

FOREIGN PATENT DOCUMENTS

JP 407245492 A 3/1995
JP 410084193 A 3/1998

Primary Examiner—Darren Schuberg
Assistant Examiner—Hung Van Duong
(74) Attorney, Agent, or Firm—Blakely, Sokoloff, Taylor & Zafman LLP

(57) ABSTRACT

A retention mechanism which may include a pair of flexible tabs. The flexible tabs may be pressed into opposing side edges of a substrate which supports an integrated circuit package. The substrate may be part of an electronic cartridge which has a cover. The flexible tab may extend through a space between the substrate and the cover such that the retention mechanism has a profile that is no greater than the cartridge. The retention mechanism may be mounted to a motherboard. The motherboard may have a connector that receives the substrate. An insertion tool can be used to plug the cartridge into the connector and couple the flexible tab to the substrate. An extraction tool can be used to pull the cartridge out of the connector and separate the substrate from the flexible tabs.

19 Claims, 4 Drawing Sheets

U.S. PATENT DOCUMENTS

| | | | |
|---|---|---|---|
| 5,303,113 A | 4/1994 | Goleman et al. | 361/93 |
| 5,309,315 A | 5/1994 | Naedel et al. | 361/704 |
| 5,323,299 A | 6/1994 | Weber | 361/818 |
| 5,333,100 A | 7/1994 | Anhalt et al. | 361/818 |
| 5,353,201 A | 10/1994 | Maeda | 361/816 |
| 5,354,951 A | 10/1994 | Lange, Sr. et al. | 174/35 R |
| 5,398,822 A | 3/1995 | McCarthy et al. | 211/41 |
| 5,422,433 A | 6/1995 | Rivera et al. | 174/35 GC |
| 5,430,607 A | 7/1995 | Smith | 361/683 |
| 5,473,111 A | 12/1995 | Hattori et al. | 174/35 R |
| 5,477,421 A | 12/1995 | Bethurum | 361/818 |
| 5,483,422 A * | 1/1996 | Bowen et al. | 361/802 |
| 5,483,423 A | 1/1996 | Lewis et al. | 361/816 |
| 5,526,229 A | 6/1996 | Wakabayashi et al. | 361/702 |
| 5,545,843 A | 8/1996 | Arvidsson et al. | 174/35 GC |
| 5,550,713 A | 8/1996 | Pressler et al. | 361/818 |
| 5,650,917 A | 7/1997 | Hsu | 361/759 |
| 5,659,459 A | 8/1997 | Wakabayashi et al. | 361/753 |
| 5,822,197 A | 10/1998 | Thuault | 361/803 |
| 5,829,601 A * | 11/1998 | Yurchenco et al. | 361/754 |
| 5,838,542 A | 11/1998 | Nelson et al. | 361/704 |
| 5,856,910 A | 1/1999 | Yurchenco et al. | 361/704 |
| 5,883,782 A | 3/1999 | Thurston et al. | 364/704 |
| 5,883,783 A | 3/1999 | Turturro | 361/704 |
| 5,889,656 A | 3/1999 | Yin | 361/804 |
| 5,943,218 A * | 8/1999 | Liu | 361/801 |
| 6,179,414 B1 * | 1/2001 | Keefe et al. | 347/65 |

* cited by examiner

INBOARD RETENTION SYSTEM FOR PROCESSOR ENCLOSURE ASSEMBLIES WITH SUBSTRATE ALIGNMENT

BACKGROUND OF THE INVENTION

1. Field of the Invention

The present invention relates to a retention mechanism for capturing a printed circuit board assembly.

2. Background Information

Integrated circuits are typically assembled to packages that are mounted to a printed circuit board. The printed circuit board may have a plurality of conductive pads which plug into a mating connector. The mating connector may be mounted to a motherboard of a computer system. The conductive pads must be aligned with corresponding contacts of the connector to properly connect the printed circuit board with the motherboard. Plugging the circuit board into the motherboard connector is typically a manual process which requires a certain level of skill to align the pads and contacts of the connector.

Computer systems are sometimes exposed to shock and vibration loads. The shock and vibration loads create stresses in the printed circuit board and the motherboard connector. Some computer systems contain mechanical guide rails which receive the edges of the printed circuit board and align the pads with the contacts when the board is being plugged into the connector. The guide rails are typically mounted to a metal frame of a computer which provides structural support for the circuit board and the connector. Some computer systems may further incorporate mechanical latches to secure the printed circuit board to the motherboard. The latches typically cooperate with the guide rails or other features of the computer chassis.

It may be desirable to enclose the printed circuit board assembly with a cover to protect the electrical components of the assembly. The cover may allow an end user to readily plug the assembly into a motherboard without making contact with the electrical components. Such an assembly may require a retention system which cooperates with the cover to insure that the printed circuit board remains plugged into the motherboard connector even when the system is subjected to shock and vibration. It would be desirable to provide a retention system that secures an enclosed printed circuit board assembly. It would also be desirable if the retention mechanism has a relatively small profile to limit the amount of motherboard space occupied by the mechanism.

SUMMARY OF THE INVENTION

One embodiment of the present invention is a retention mechanism which may include a retention beam that has a flexible tab. The flexible tab may be pressed into a side edge of a substrate which supports an integrated circuit package.

DETAILED DESCRIPTION OF THE INVENTION

One embodiment of the present invention is a retention mechanism which may include a pair of flexible tabs. The flexible tabs may be pressed into opposing side edges of a substrate which supports an integrated circuit package. The substrate may be part of an electronic cartridge which has a cover. The flexible tab may extend through a space between the substrate and the cover. The retention mechanism may be mounted to a motherboard. The motherboard may have a connector that receives the substrate. An insertion tool can be used to plug the cartridge into the connector and couple the flexible tab to the substrate. An extraction tool can be used to separate the substrate from the flexible tabs and pull the cartridge out of the connector.

Figure 1:
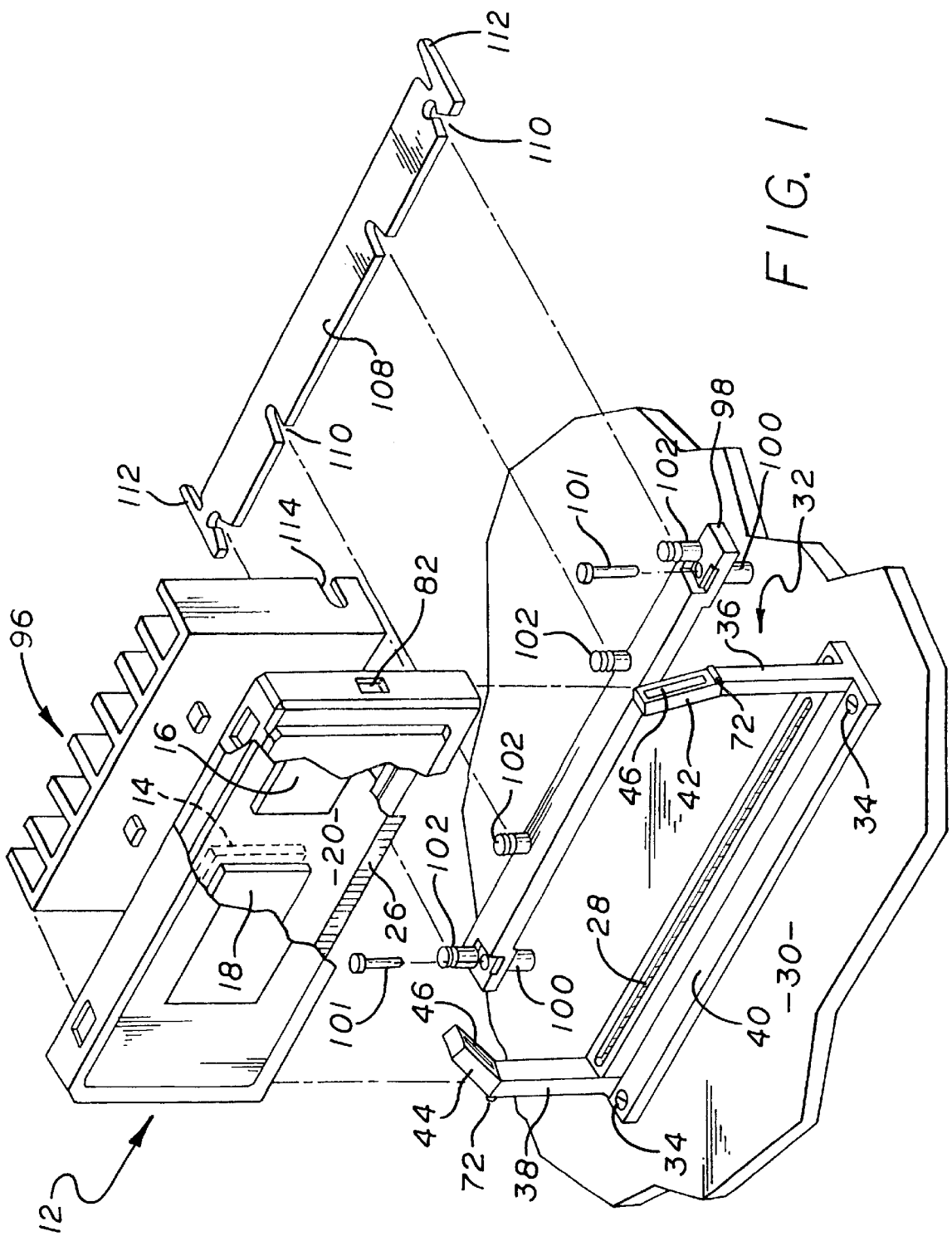
FIG. 1 is a perspective view of an embodiment of an electronic cartridge of the present invention.

Referring to the drawings more particularly by reference numbers, FIG. 1 shows an embodiment of an electronic assembly 10 of the present invention. The assembly 10 may include an electronic cartridge 12. The cartridge 12 may have a plurality of integrated circuit packages 14, 16 and 18 that are mounted to a substrate 20.

Figure 2A:
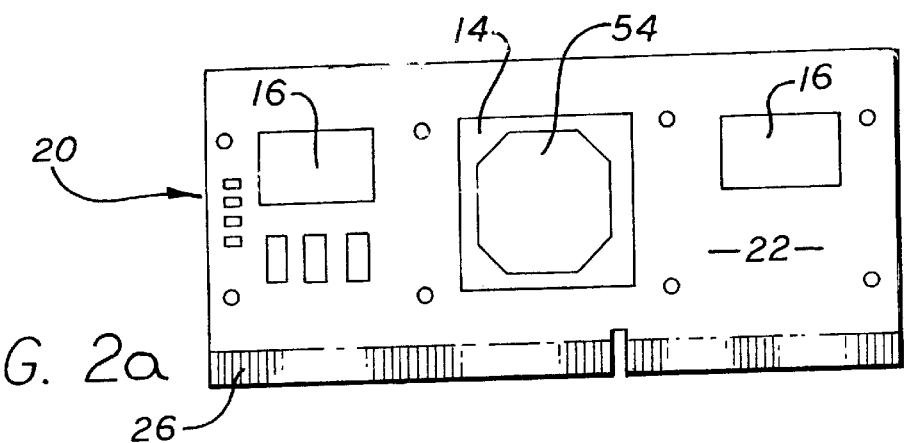
FIG. 2a is a front view of a printed circuit board assembly of the cartridge.
Figure 2B:
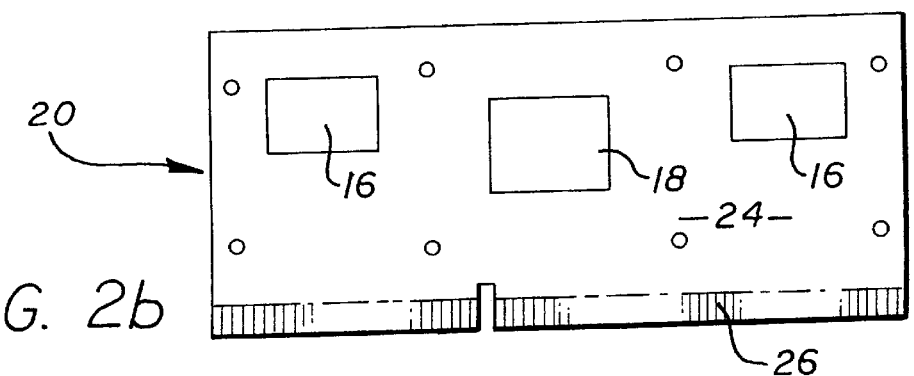
FIG. 2b is a rear view of the printed circuit board assembly.

FIGS. 2a and 2b show the integrated circuit packages 14, 16 and 18 mounted to a first side 22 and a second side 24 of the substrate 20. The substrate 20 may be a printed circuit board which has surface pads, routing traces, power/ground planes, vias, etc. One edge of the substrate 20 may have a plurality of conductive pads 26.

Referring to FIG. 1 the conductive pads 26 may be inserted into an electrical connector 28. The electrical connector 28 may be mounted to a motherboard 30. The motherboard 30 may be a printed circuit board that is coupled to other electronic devices. By way of example, the motherboard 30 may support and be connected to memory devices (not shown). Although a card edge connector 28 is shown and described, it is to be understood that the assembly may employ other types of connectors such as a pin connector.

The assembly 10 may also include a retention mechanism 32 that is mounted to the motherboard 30 by fasteners 34. The retention mechanism 32 secures the cartridge 12 to the motherboard 30 when the pads 26 are inserted into the connector 28. The retention mechanism 32 may include a first retention beam 36 and a second retention beam 38 that are connected by a pair of support beams 40. The first retention beam 36 may have a first flexible tab 42. The second retention beam 38 may have a second flexible tab 44. Each flexible tab 42 and 44 may have an opening 46. The retention mechanism 32 may be constructed as one integral injection molded part.

Figure 3:
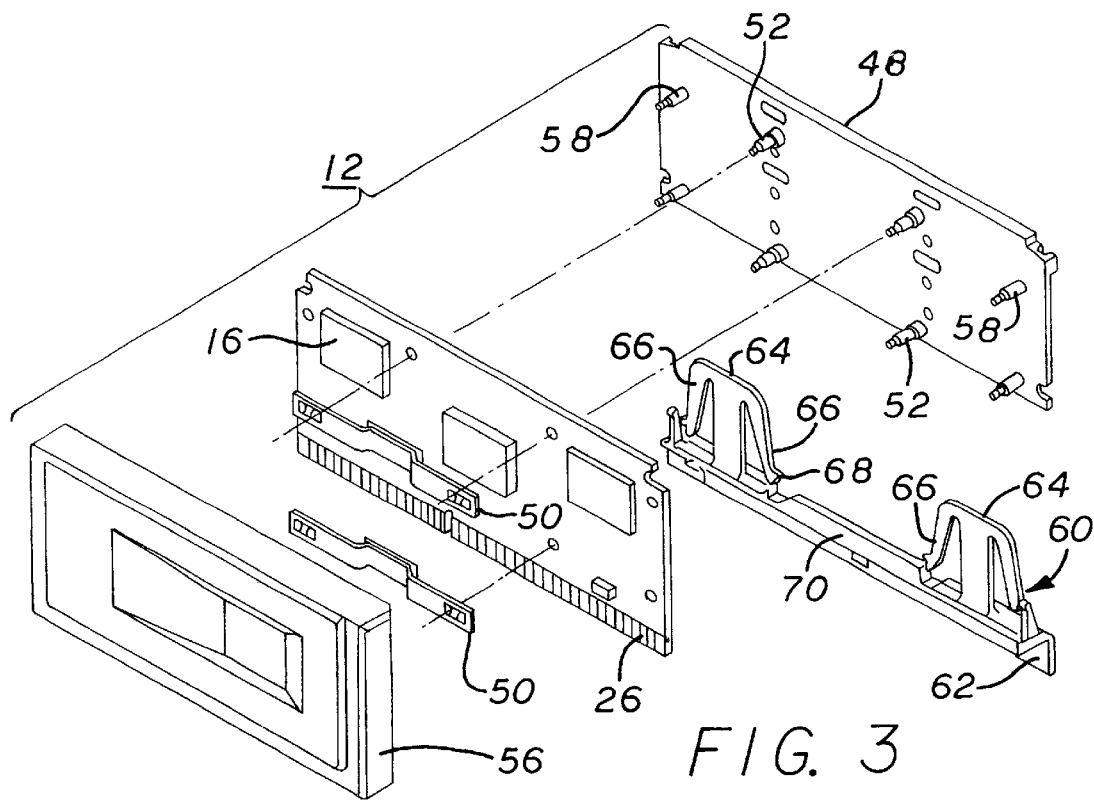
FIG. 3 is an exploded view of the electronic cartridge.

As shown in FIG. 3, the cartridge 12 may have a thermal plate 48 that is attached to the substrate 20 by spring clips 50 and pins 52. The thermal plate 48 can be thermally coupled directly to a metal lid 54 (see FIG. 2a) of the integrated circuit package 14. The thermal plate 48 may also be attached to a cover 56 by pins 58. The cover 56 and thermal plate 48 may essentially enclose the integrated circuit packages 14, 16 and 18. The thermal plate 48 is typically constructed from a thermally and electrically conductive material such as aluminum or copper. The pins 52 and 58 may also be constructed from a metal material such as aluminum or steel.

To minimize the weight of the assembly 10 the width of the thermal plate 48 may be limited to the area of the substrate 20 which contains the integrated circuit packages 14, 16 and 18. The width limitation of the plate 48 may expose the conductive pads 26 on one side of the substrate 20. The cartridge 12 may include a shield 60 that is attached to the thermal plate 48 and located adjacent to the pads 26.

The shield 60 may include a base portion 62 that covers the conductive pads 26. Extending from the base 62 are a pair of arms 64. Each arm 64 may have a pair of fingers 66 that extend back toward the base 62. Each finger 66 may have a notch 68 that receives one of the pins 52 or 58. When assembled the fingers 66 may be slightly deflected to create a spring force which pushes a lip 70 of the base 62 into the thermal plate 48 and secures the shield 60 in a plane parallel with the substrate 20.

Figure 4A:
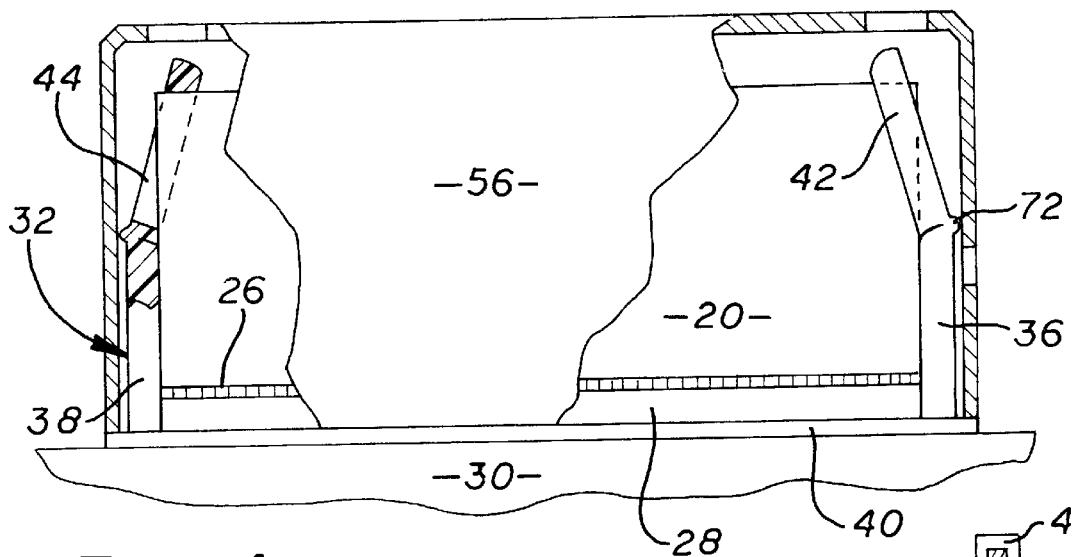
FIG. 4a is a front view showing the electronic cartridge plugged into a motherboard.
Figure 4B:
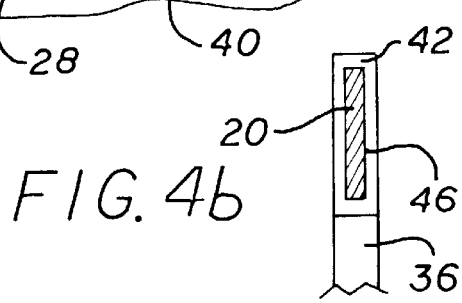
FIG. 4b is a side view showing a portion of a substrate that extends into an opening of a retention mechanism.

As shown in FIG. 4a, when the cartridge 12 is plugged into the connector 28, the retention beams 36 and 38 may extend between spaces that separate the cover 56 from the substrate 20. The flexible tabs 42 and 44 may be pressed into the sides of the substrate 20. The chamfered surfaces 46 may engage the lower corners of the substrate so that the tabs 42 and 44 are deflected in an outward direction when the substrate 20 is initially pushed into the retention mechanism 32 toward the connector 28. The flexible tabs 42 and 44 may each have hinges 72 which allow the tabs 42 and 44 to bend outward. The hinges 72 provide a spring force which presses the tabs 42 and 44 into the sides of the substrate 20. The corners of the substrate 20 may extend into the openings 46 to secure the cartridge 12 to the retention mechanism 32.

Figure 5:
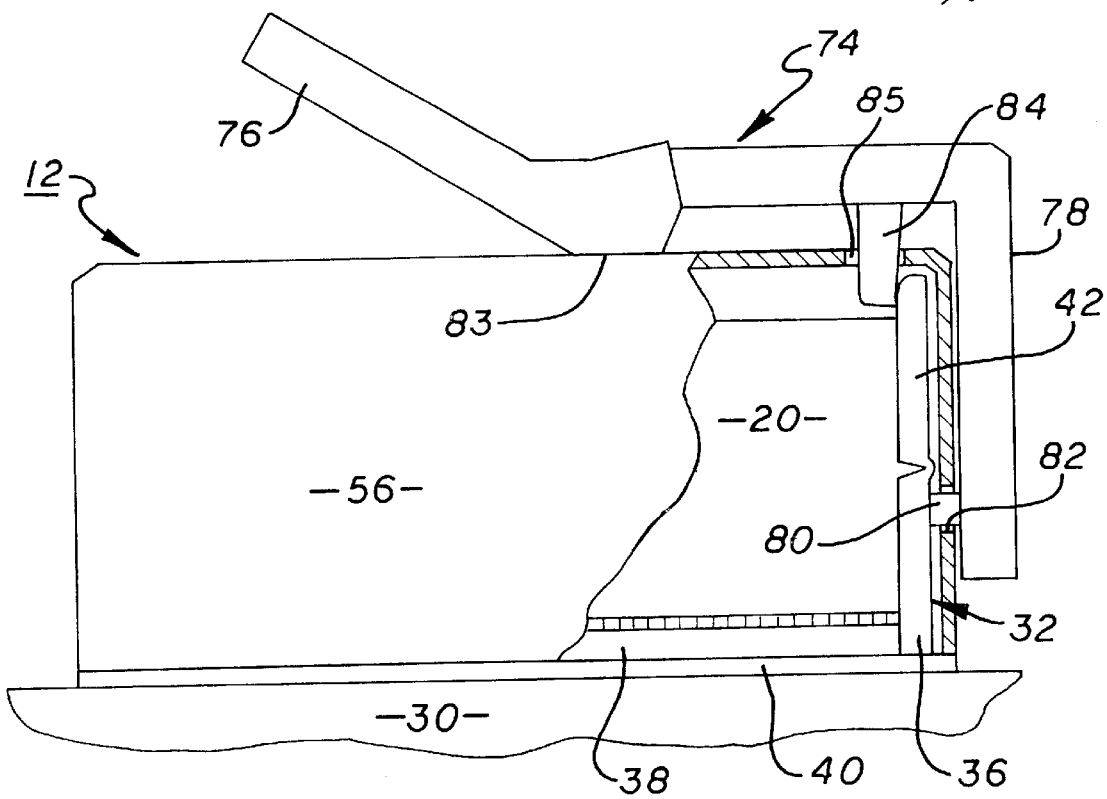
FIG. 5 is a front view showing an insertion tool that can be utilized to plug the cartridge into the motherboard.

As shown in FIG. 5, there may be provided an insertion tool 74 which is used to mate the cartridge 12 with the connector 28 and the retention mechanism 32. The insertion tool 74 may include a lever 76 which extends from a base 78. The base 78 may have a tab 80 that extends into a corresponding port 82 of the cover 56. The lever 76 may have a cam surface 83 which pushes the cartridge 12 into the retention mechanism 32 and connector 28 when the tool 74 is pivoted about the tab 80. The tool 74 may have another tab 84 which extends through an opening 85 of the cartridge 12 and deflects the tab 42.

Figure 6:
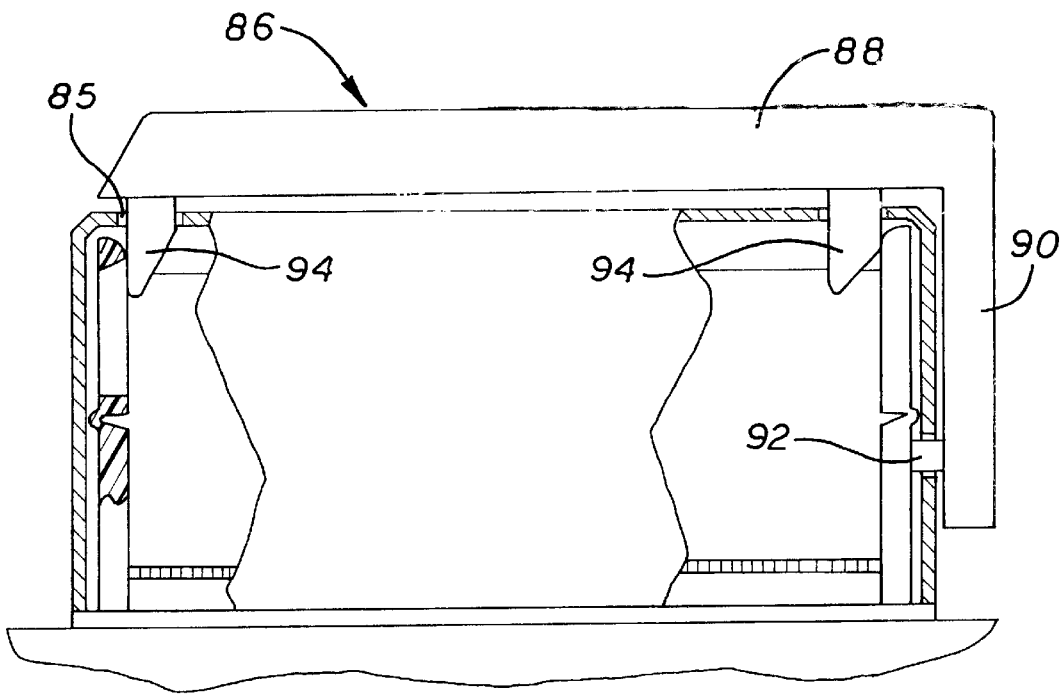
FIG. 6 is a front view showing an extraction tool that can be utilized to unplug the cartridge from the motherboard.

As shown in FIG. 6, there may also be provided an extraction tool 86 which is used to separate the cartridge 12 from the connector 28 and the retention mechanism 32. The extraction tool 86 may include a lever 88 that extends from a base 90. The base 90 may have a tab 92 that extends into the port 82 of the cover 56. The lever 88 may have a pair of tabs 94 that engage and separate the flexible tabs 42 and 44 of the retention mechanism 32 from the substrate 20 so that the cartridge 12 can be detached from the connector 28. The tabs 94 extend through openings 85 in the cartridge 12.

Figure 7:
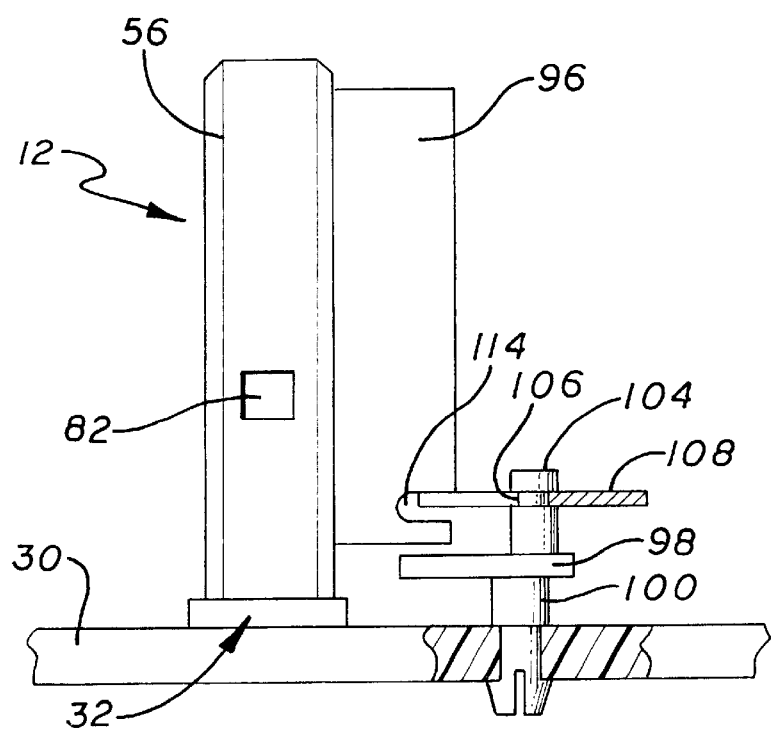
FIG. 7 is a side view of the electronic assembly.

Referring to FIGS. 1 and 7, a heat sink 96 can be attached to the thermal plate 48 to more efficiently remove heat generated by the integrated circuits within the packages 14, 16 and 18. The assembly 10 may include a base plate 98 that is mounted to the motherboard 30. The base plate 98 may have a pair of inserts 100 that are pressed into the motherboard 30 and a pair of pins 101 that are pressed into the inserts 100.

Extending from the base plate 98 are a plurality of posts 102. Each post 102 may have a head portion 104 that is located adjacent to a neck portion 106. The posts 102, base plate 98 and inserts 100 may be molded as an integral plastic part.

The assembly 10 may further include a tie bar 108 that is coupled to the heat sink 96 and the post 102. The tie bar 108 may have a plurality of slots 110 that are inserted onto the neck portions 106 of the posts 102. The ends of the tie bar 108 may have levers 112 which can be pushed inward to enlarge the outer slots 110 and allow an operator to pull the tie bar 108 away from the post 102. The tie bar 108 may be inserted into a corresponding groove 114 of the heat sink 96.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A retention mechanism for capturing a substrate which has a corner, comprising:

a cover coupled to said substrate; and a first retention beam which has a first flexible tab having a slot that is adapted to engage said corner of the substrate, said flexible tab being adapted to extend between said substrate and said cover.

2. The retention mechanism as recited in claim 1, further comprising a second retention beam that has a second flexible tab and which is separated from said first retention beam by a support beam.

3. The retention mechanism as recited in claim 2, wherein said first and second retention beams each have a hinge.

4. An electronic assembly, comprising:

a substrate which has a corner;

an integrated circuit package mounted to said substrate;

a cover coupled to said substrate;

a circuit board; and, a retention mechanism that is mounted to said circuit board and which has a flexible tab having a slot that is adapted to engage said corner of said substrate, said flexible tab being adapted to extend between said substrate and said cover.

5. The assembly as recited in claim 4 further comprising a thermal plate that is coupled to said substrate.

6. The assembly as recited in claim 4, further comprising a connector that is mounted to said circuit board and is coupled to said substrate.

7. The assembly as recited in claim 4, wherein the circuit board is a motherboard.

8. An insertion tool for an electronic cartridge that can be coupled to a retention mechanism which has a flexible tab, the electronic cartridge having a cover with a port, comprising:

a base which has a tab that is adapted to be inserted into the cover port;

a lever which extends from said base and is adapted to engage the electronic cartridge.

9. An extraction tool for an electronic cartridge that can be coupled to a retention mechanism which has a pair of flexible tabs, the electronic cartridge having a cover with a port and a pair of openings, comprising:

a base which has a tab that is adapted to be inserted into the cover port; and, a lever that extends from said base and which has a pair of tabs adapted to be inserted into the openings and engage the flexible tabs.

10. An electronic assembly, comprising:

a substrate which has an edge;

an integrated circuit package mounted to said subsrate;

cover coupled to said substrate;

a circuit board;

a retention mechanism that is mounted to said circuit board and which has a flexible tab that is adapted to be pressed into said edge of said substrate; and, an insertion tool including a tab that can be inserted into a port of said cover.

11. The assembly as recited in claim 10, further comprising a thermal plate that is coupled to said substrate.

12. The assembly as recited in claim 11, further comprising a connector that is mounted to said circuit board and is coupled to said substrate.

13. An electronic assembly, comprising:

a substrate which has an edge;

an integrated circuit package mounted to said substrate;

a cover coupled to said substrate;

a circuit board;

a retention mechanism that is mounted to said circuit board and which has a flexible tab that is adapted to be pressed into said edge of said substrate; and an extraction tool including a tab that can be inserted into a port of said cover.

14. The assembly as recited in claim 13, further comprising a thermal plate that is coupled to said substrate.

15. The assembly as recited in claim 14, further comprising a connector that mounted to said circuit board and is coupled to said substrate.

16. An electronic assembly, comprising:

a substrate having a corner;

a cover coupled to said substrate;

a circuit board;

a retention mechanism mounted to said circuit board, said retention mechanism including a flexible tab having a slot that is adapted to engage said corner of said substrate; and an insertion tool including a tab that can be inserted into a port of said cover.

17. The electronic assembly as recited in claim 16 further comprising an integrated circuit package mounted to said substrate.

18. An electronic assembly, comprising:

a substrate having a corner;

a an integrated circuit package mounted to said substrate;

a cover coupled to said substrate;

a circuit board;

a retention mechanism mounted to said circuit board, said retention mechanism including a flexible tab having a slot that is adapted to engage said corner of said substrate; and an extraction tool including a tab that can be inserted into a port of said cover.

19. The electronic assembly as recited in claim 18 further comprising an integrated circuit package mounted to said substrate.

* * * * *